(12) United States Patent
Larson et al.

(10) Patent No.: US 7,169,231 B2
(45) Date of Patent: Jan. 30, 2007

(54) GAS DISTRIBUTION SYSTEM WITH TUNING GAS

(75) Inventors: Dean J. Larson, Pleasanton, CA (US); Babak Kadkhodayan, Hayward, CA (US); Di Wu, Newark, CA (US); Kenji Takeshita, Fremont, CA (US); Bi-Ming Yen, Fremont, CA (US); Xingcai Su, Fremont, CA (US); William M. Denty, Jr., San Jose, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 110 days.

(21) Appl. No.: 10/318,612

(22) Filed: Dec. 13, 2002

(65) Prior Publication Data

US 2004/0112538 A1 Jun. 17, 2004

(51) Int. Cl.
C23C 16/52 (2006.01)
C23C 16/455 (2006.01)
C23C 16/00 (2006.01)
H01L 21/306 (2006.01)

(52) U.S. Cl. .............. 118/715; 156/345.29; 156/345.33

(58) Field of Classification Search ................ 118/715; 156/345.29, 345.33, 345.34, 345.26
See application file for complete search history.

(56) References Cited

U.S. PATENT DOCUMENTS

| | | | |
|---|---|---|---|
| 4,275,752 A | 6/1981 | Collier et al. | |
| 4,369,031 A | 1/1983 | Goldman et al. | |
| 4,812,201 A | 3/1989 | Sakai et al. | 156/643 |
| 4,835,114 A | 5/1989 | Satou et al. | |
| 4,980,204 A * | 12/1990 | Fujii et al. | 117/98 |
| 5,013,398 A | 5/1991 | Long et al. | 156/643 |
| 5,077,875 A | 1/1992 | Hoke et al. | |
| 5,134,965 A | 8/1992 | Tokuda et al. | 118/723 |
| 5,200,388 A | 4/1993 | Abe et al. | |
| 5,288,325 A | 2/1994 | Gomi | |
| 5,310,426 A | 5/1994 | Mori | |
| 5,313,982 A | 5/1994 | Ohmi et al. | |
| 5,356,515 A | 10/1994 | Tahara et al. | 156/643 |
| 5,415,728 A | 5/1995 | Hasegawa et al. | 156/643.1 |
| 5,431,738 A * | 7/1995 | Murakami et al. | 118/720 |

(Continued)

FOREIGN PATENT DOCUMENTS

EP 0 291 181 A2 11/1988

(Continued)

OTHER PUBLICATIONS

International Search Report, date of mailing Sep. 1, 2004.

(Continued)

*Primary Examiner*—Jeffrie R. Lund
(74) *Attorney, Agent, or Firm*—Beyer Weaver & Thomas LLP (57) ABSTRACT

An apparatus for providing different gases to different zones of a processing chamber is provided. A gas supply for providing an etching gas flow is provided. A flow splitter in fluid connection with the gas supply for splitting the etching gas flow from the gas supply into a plurality of legs is provided. A tuning gas system in fluid connection to at least one of the legs of the plurality of legs is provided.

13 Claims, 4 Drawing Sheets

U.S. PATENT DOCUMENTS

| | | | |
|---|---|---|---|
| 5,460,654 A | 10/1995 | Kikkawa et al. | |
| 5,496,408 A * | 3/1996 | Motoda et al. | 118/715 |
| 5,522,934 A | 6/1996 | Suzuki et al. | 118/723 |
| 5,532,190 A * | 7/1996 | Goodyear et al. | 438/710 |
| 5,589,110 A | 12/1996 | Motoda et al. | |
| 5,614,055 A | 3/1997 | Fairbairn et al. | 156/345 |
| 5,620,524 A | 4/1997 | Fan et al. | |
| 5,651,825 A | 7/1997 | Nakahigashi et al. | |
| 5,702,530 A * | 12/1997 | Shan et al. | 118/723 MP |
| 5,736,457 A | 4/1998 | Zhao | 438/624 |
| 5,744,049 A | 4/1998 | Hills et al. | 216/67 |
| 5,772,771 A | 6/1998 | Li et al. | 118/723 I |
| 5,853,484 A * | 12/1998 | Jeong | 118/715 |
| 5,865,205 A | 2/1999 | Wilmer | |
| 5,916,369 A * | 6/1999 | Anderson et al. | 118/715 |
| 5,950,693 A | 9/1999 | Noah et al. | |
| 5,993,555 A * | 11/1999 | Hamilton | 118/715 |
| 6,001,172 A * | 12/1999 | Bhandari et al. | 117/84 |
| 6,009,830 A | 1/2000 | Li et al. | 118/723 R |
| 6,013,155 A | 1/2000 | McMillin et al. | 156/345 |
| 6,015,595 A * | 1/2000 | Felts | 427/446 |
| 6,019,060 A | 2/2000 | Lenz | 118/723 R |
| 6,039,074 A | 3/2000 | Raaijmakers et al. | |
| 6,042,687 A | 3/2000 | Singh et al. | 156/345 |
| 6,058,958 A | 5/2000 | Benkowski et al. | |
| 6,090,210 A | 7/2000 | Ballance et al. | |
| 6,119,710 A | 9/2000 | Brown | |
| 6,132,515 A | 10/2000 | Gauthier | |
| 6,155,289 A | 12/2000 | Carlsen et al. | |
| 6,192,919 B1 | 2/2001 | Jackson et al. | |
| 6,224,681 B1 | 5/2001 | Sivaramakrishnan et al. | |
| 6,251,792 B1 | 6/2001 | Collins et al. | |
| 6,253,783 B1 | 7/2001 | Carlsen et al. | |
| 6,296,711 B1 | 10/2001 | Loan et al. | |
| 6,302,139 B1 | 10/2001 | Dietz | |
| 6,315,858 B1 | 11/2001 | Shinozuka et al. | |
| 6,333,272 B1 * | 12/2001 | McMillin et al. | 438/710 |
| 6,457,494 B1 | 10/2002 | Gregg et al. | |
| 6,508,913 B2 * | 1/2003 | McMillin et al. | 156/345.29 |
| 6,589,350 B1 * | 7/2003 | Swartz | 118/710 |
| 6,632,322 B1 | 10/2003 | Gottscho et al. | 156/345.33 |
| 6,752,166 B2 * | 6/2004 | Lull et al. | 137/9 |
| 2001/0047760 A1 | 12/2001 | Moslehi | |
| 2002/0014207 A1 | 2/2002 | Sivaramakrishnan et al. | |
| 2002/0018965 A1 | 2/2002 | Vahedi et al. | 430/314 |
| 2002/0100416 A1 | 8/2002 | Sun et al. | |
| 2002/0108570 A1 | 8/2002 | Lindfors | |
| 2002/0108933 A1 | 8/2002 | Hoffman et al. | |
| 2002/0144657 A1 | 10/2002 | Chiang et al. | |
| 2002/0144706 A1 | 10/2002 | Davis et al. | 134/1.1 |
| 2002/0160125 A1 | 10/2002 | Johnson et al. | |
| 2002/0170598 A1 | 11/2002 | Girard et al. | |
| 2002/0173160 A1 | 11/2002 | Keil et al. | 438/717 |
| 2002/0192369 A1 | 12/2002 | Morimoto et al. | |
| 2003/0003696 A1 | 1/2003 | Gelatos et al. | |
| 2003/0019580 A1 | 1/2003 | Strang | |
| 2003/0070620 A1 | 4/2003 | Cooperberg et al. | |
| 2003/0084848 A1 * | 5/2003 | Long | 118/715 |
| 2003/0094903 A1 | 5/2003 | Tao et al. | |
| 2003/0130807 A1 * | 7/2003 | Ambrosina et al. | 702/45 |
| 2003/0226641 A1 | 12/2003 | Collins et al. | 156/345.49 |
| 2004/0050326 A1 * | 3/2004 | Thilderkvist et al. | 118/715 |
| 2004/0112538 A1 * | 6/2004 | Larson et al. | 156/345.33 |
| 2004/0112539 A1 * | 6/2004 | Larson et al. | 156/345.33 |
| 2004/0112540 A1 * | 6/2004 | Larson et al. | 156/345.33 |
| 2004/0129211 A1 | 7/2004 | Blonigan et al. | |

FOREIGN PATENT DOCUMENTS

| | | |
|---|---|---|
| EP | 1077476 | 2/2001 |
| EP | 1 158 565 A2 | 11/2001 |
| JP | 403-281780 * | 12/1991 |
| WO | 01/29879 A2 | 4/2001 |
| WO | 02/080251 A1 | 10/2002 |

OTHER PUBLICATIONS

U.S. Office Action mailed Apr. 27, 2005 from U.S. Appl. No. 10/685,739.

U.S. Office Action mailed Sep. 27, 2005 from U.S. Appl. No. 10/642,083.

U.S. Office Action mailed Oct. 14, 2005 from U.S. Appl. No. 10/685,739.

Mirriam-Webster's Collegiate Dictionary—10th Ed. P. 820 ("orifice").

C. Janowiak et al., "Etching of organic low dielectric constant material SiLK™ on the Lam Research Corporation 4520XLE™", J. Vac. Sci. Technol. A 18(4), Jul./Aug. 2000, pp. 1859-1863.

International Search Report, dated Dec. 1, 2005.

U.S. Office Action mailed Mar. 9, 2006 from U.S. Appl. No. 10/642,083.

U.S. Office Action mailed Mar. 9, 2006 from U.S. Appl. No. 10/685,739.

* cited by examiner

GAS DISTRIBUTION SYSTEM WITH TUNING GAS

BACKGROUND OF THE INVENTION

Semiconductor processing includes deposition processes such as chemical vapor deposition (CVD) of metal, dielectric and semiconducting materials, etching of such layers, ashing of photoresist masking layers, etc. Such semiconductor processes are typically carried out in vacuum chambers wherein process gas is used to treat a substrate such as a semiconductor wafer, flat panel display substrate, etc. The process gas can be supplied to the interior of the vacuum chamber by a gas distribution system such as a showerhead, a gas distribution ring, gas injectors, etc. Reactors having plural gas distribution systems are disclosed in U.S. Pat. Nos. 5,134,965; 5,415,728; 5,522,934; 5,614,055; 5,772,771; 6,013,155; and 6,042,687.

In the case of etching, plasma etching is conventionally used to etch metal, dielectric and semiconducting materials. A plasma etch reactor typically includes a pedestal supporting the silicon wafer on a bottom electrode, an energy source which energizes process gas into a plasma state, and a process gas source supplying process gas to the chamber.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

It is desirable to evenly distribute the plasma over the surface of the wafer in order to obtain uniform etching rates over the entire surface of the wafer. Some gas distribution chamber designs include multiple supply lines and multiple mass flow controllers (MFCs) feeding separate regions in the chamber. However, these gas distribution designs require numerous components, complexity in design and high cost. It therefore would be desirable to reduce the complexity and cost to manufacture such gas distribution arrangements.

Figure 1:
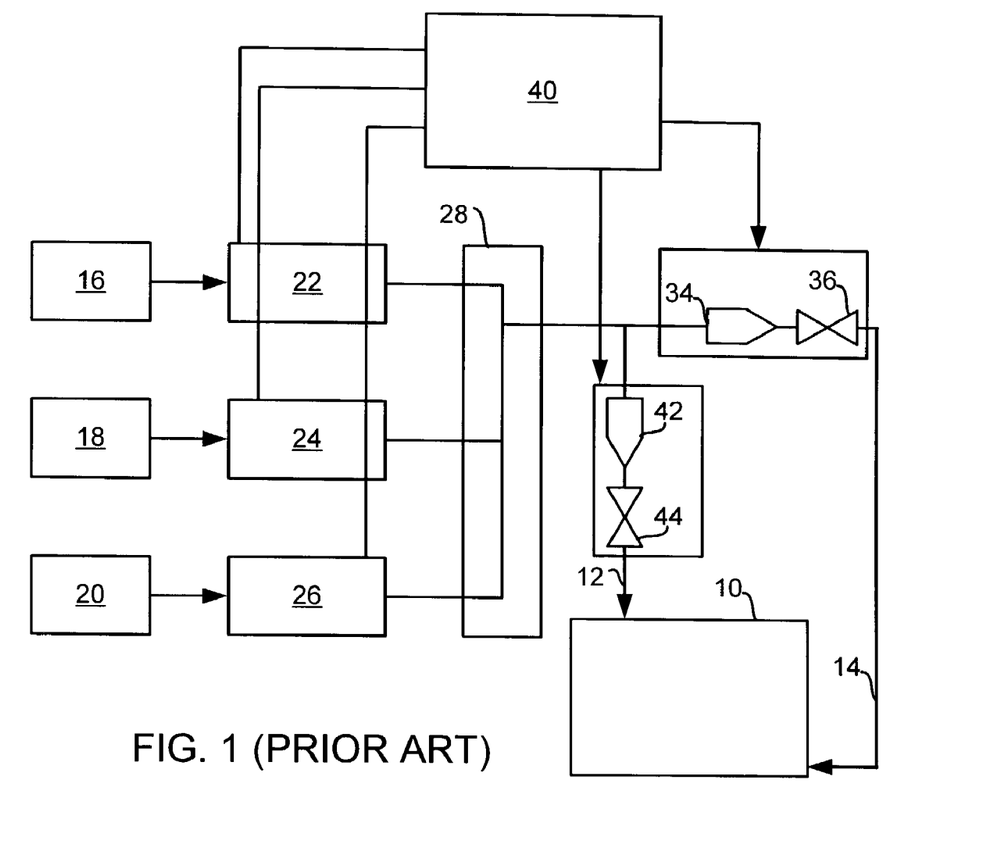
FIG. 1 is a schematic view of a dual gas feed device used in the prior art.

U.S. Pat. No. 6,333,272, which is incorporated by reference, describes a dual feed gas distribution system for semiconductor processing, wherein a processing chamber 10 is supplied processing gas through gas supply line 12 (which can provide process gas to a showerhead or other gas supply arrangement arranged in the upper portion of the chamber) and a gas supply line 14 (which supplies processing gas to a lower portion of the chamber such as, for example, to a gas distribution ring surrounding the substrate holder or through gas outlets arranged in the substrate support), as shown in FIG. 1. However, an alternative dual gas feed arrangement can supply gas to the top center and top perimeter of the chamber. Processing gas is supplied to the gas lines 12, 14 from gas supplies 16, 18, 20, the process gasses from supplies 16, 18, 20 being supplied to mass flow controllers 22, 24, 26, respectively. The mass flow controllers 22, 24, 26 supply the process gasses to a mixing manifold 28 after which the mixed gas is directed to the flow lines 12, 14. Flow line 12 may include a combination of a flow meter 42 and a feedback controlled throttling valve 44 and flow line 14 may include a flow measurement device 34 and a feedback control valve 36, so that the process feed gas is split using two throttling valves and two flow meters. A control system 40 monitors the flow measurement devices 34 and 42 and is effective to control the mass flow controllers 22, 24, 26 as well as the feedback control valves 36 and 44. This feedback control system allows adjustment of the proportion of mixed gas delivered to two zones of the processing chamber. The open aperture of one or both of the throttle valves can be adjusted based upon a comparison of the user selected flow-splitting and flow meter readings. Conveniently, the combination of the flow meter and throttling valve could be implemented using a conventional mass flow controller, where the control system sends separate flow setpoint controls to each leg to achieve the user's selected flow splitting.

In operation, the user would select set points for the flows of each feed gas within the gas box, and would select the fraction of mixed flow to be delivered to each region of the processing chamber. For example, the user might select a flow of 100 sccm $Cl_2$/200 sccm $BCl_3$/4 sccm $O_2$ with 75% delivered through line 12 and 25% through line 14. The fraction of mixed flow in the respective delivery lines is controlled by repeated adjustment of the feedback control valve 36 in line 14 based upon the actual flow measured in line 14 with respect to its target flow, while the feedback control valve 44 in line 12 is full open. By comparing the total flow, which in this case could be measured by summing all of the flow readouts of the mass flow controllers 22, 24, 26 in the gas box, with the flow measured by the meter 42 in the chamber delivery line 12, the controller can adjust the degree of throttling in the valve 36 in line 14 to achieve the desired flow distribution. Alternatively, an optional total flow meter could be installed just downstream of the mixing manifold 28 to measure the total flow of mixed gas, rather than determining the total flow by summing the readouts of the MFCs 22, 24, 26 in the gas box.

In the case where the total flow is determined by summing the gas box MFC readouts, these measured flow rates can be converted to equivalent standard cubic centimeters per minute (sccms) of a reference gas, such as nitrogen, to provide accurate and flexible control in the general case where the gas mixture may differ from process to process. Hence, a calculation could be performed to convert mixed gas flow to a "nitrogen equivalent flow" and the in-line flow measurement device in line 14 could be calibrated to measure "nitrogen equivalent flow" to put all flow measurements on the same basis. As an example, in a typical thermal-based mass flow meter 100 sccm of $Cl_2$ is equivalent to 116.5 sccm of nitrogen, 200 sccm of $BCl_3$ is equivalent to 444.4 sccm of nitrogen, and 4 sccm of $O_2$ is equivalent to 4.08 sccm of nitrogen. Hence, the "nitrogen equivalent flow" of the mixed gas in the example above is 564.98 sccm and to deliver 25% through the line with the feedback controlled valve, the control loop could adjust the valve to achieve a flow reading of 0.25*564.98=141.2 sccm of nitrogen for this example. Note that at steady state, the entire flow of mixed gas from the gas box will ultimately reach the chamber, because the optional flow restrictor in line 12 is not being adjusted during the process, and the pressure will naturally build in the mixing manifold until the total in flow equals the total out flow.

SUMMARY OF THE INVENTION

To achieve the foregoing and in accordance with the purpose of the present invention, an apparatus for providing different gases to different zones of a processing chamber is provided. A gas supply for providing an etching gas flow is provided. A flow splitter in fluid connection with the gas supply for splitting the etching gas flow from the gas supply into a plurality of legs is provided. A tuning gas system in fluid connection to at least one of the legs of the plurality of legs is provided.

In another embodiment, a tuning system for tuning a gas feed system for a processing chamber with a controller, where the gas feed system comprises a first leg for supplying a processing gas to a first part of the processing chamber, a second leg for supplying the processing gas to a second part of the processing chamber, and a flow ratio device for maintaining a flow ratio between the first leg and the second leg is provided. A first gas line in fluid connection with the first leg is provided. A second gas line in fluid connection with the second leg is provided. A tuning gas source in fluid connection with the first gas line and the second gas line is provided. A mass flow controller connected between the first gas line and the tuning gas source is provided.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
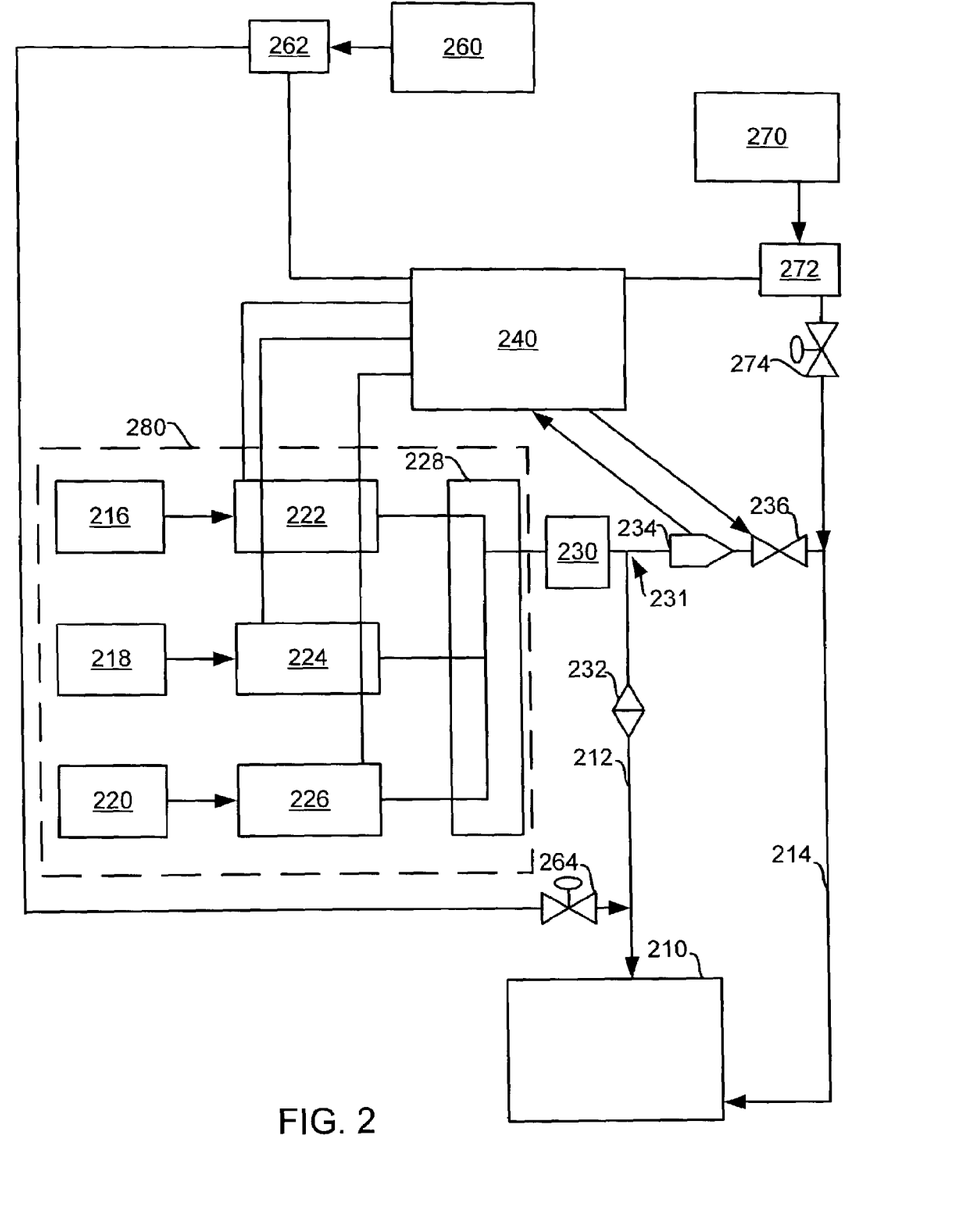
FIG. 2 is a schematic view of a tuning device on a dual gas feed device.

FIG. 2 is a schematic illustration of an embodiment of the invention. A processing chamber 210 is supplied processing gas through gas supply line 212 (which can provide process gas to a showerhead or other gas supply arrangement arranged in the upper portion of the chamber) and a gas supply line 214 (which supplies processing gas to a lower portion of the chamber such as, for example, to a gas distribution ring surrounding the substrate holder or through gas outlets arranged in the substrate support). However, an alternative dual gas feed arrangement can supply gas to the top center and top perimeter of the chamber. The processing chamber 210 may be a plasma etcher. Processing gas is supplied to the gas lines 212, 214 from gas supplies 216, 218, 220, the process gasses from supplies 216, 218, 220 being supplied to mass flow controllers 222, 224, 226, respectively. The mass flow controllers 222, 224, 226 supply the process gasses to a mixing manifold 228 after which the mixed gas passes through an optional flow meter 230, which in turn directs the mixed process gas through a flow divider 231 to two legs, which are the flow lines 212, 214. Flow line 212 can include an optional flow restricting device 232 and flow line 214 can include a flow measurement device 234 and a feedback control valve 236. The gas supplies 216, 218, 220, mass flow controllers 222, 224, 226, and mixing manifold 228 form a gas box 280. Other types of gas supplies may be used instead of a gas box.

A control system 240 monitors the flow measurement device 234 and is effective to control the mass flow controllers 222, 224, 226 as well as the feedback control valve 236. This feedback control system allows adjustment of the proportion of mixed gas delivered to two zones of the processing chamber. The optional flow restricting device 232 can be a fixed orifice or needle valve or the like.

The flow divider 231, flow lines 212, 214, the restricting device 232, flow measurement device 234, and feedback control valve 236 form a flow splitter, which is able to provide set ratios of the flow through the flow lines 212, 214 to different parts of the processing chamber 210. Such a flow splitter provides a plurality of legs, where each leg provides a fraction of the flow from the gas source to a different part of the processing chamber 210.

A first tuning gas mass flow controller 262 is in fluid connection with a first downstream tuning gas supply 260 and is controllably connected to the control system 240. The first tuning gas mass flow controller 262 is in fluid connection with gas supply line 212. An on/off valve 264 may be connected between the first tuning gas mass flow controller 262 and the gas supply line 212. A second downstream tuning gas supply 270 is also provided. A second tuning gas mass flow controller 272 is in fluid connection with the second downstream tuning gas supply 270 and is controllably connected to the control system 240. The second tuning gas mass flow controller 272 is in fluid connection with gas supply line 214. An on/off valve 274 may be connected between the second tuning gas mass flow controller 272 and the gas supply line 214. The tuning gas is preferably the same as a component gas provided by the gas source 280. The tuning gas can be an inert carrier gas, such as argon. The first downstream tuning gas supply 260 and the second downstream tuning gas supply 270 may be considered a tuning gas source. The tuning gas source, the first tuning gas mass flow controller 262, the on/off valve 264, the second tuning gas mass flow controller 272, and the second on/off valve 274 form a tuning gas system that is in fluid connection with and supplies tuning gas to the first and second legs.

In operation, the user would select set points for the flows of each feed gas within the gas box, and would select the fraction of mixed flow to be delivered to each region of the processing chamber. For example, the user might select a flow of 100 sccm $Cl_2$/200 sccm $BCl_3$/4 sccm $O_2$ with 75% delivered through line 212 and 25% through line 214. The fraction of mixed flow in the respective delivery lines is controlled by repeated adjustment of the feedback control valve in line 214 based upon the actual flow measured in line 214 with respect to its target flow. By comparing the total flow, which in this case could be measured by summing all of the flow readouts of the mass flow controllers 222, 224, 226 in the gas box, with the flow measured by the meter in the chamber delivery line 212, the controller can adjust the degree of throttling in the valve 236 in line 214 to achieve the desired flow distribution. In this example, the valve 236 acts as a flow resistance device in the second leg to obtain the desired flow ratio between the first leg and second leg. The control system 240 is able to adjust the resistance and thus the flow through the second leg by adjusting the feedback control valve 236.

Thus the gas delivered through a first leg, line 212, is identical and three times the rate of gas delivered through the second leg, line 214. In addition to having different flow ratios between the different legs, it is desirable to have other differences in the gases delivered through the legs. For example, it may be desirable to have a higher percentage flow of carrier gas, such as argon in the second leg, line 214, flowing in the bottom of the chamber 210. In such a case, the controller 240 signals to the second tuning gas mass flow controller 272 to provide an increased percentage of flow of the carrier gas.

In another example, if it is desired that a higher concentration of an active etching gas component is desired in the first leg, line 212, controller 240 signals to the first tuning gas mass flow controller 262 to provide an increased amount of the active etching gas component from the first tuning gas source 260. The valves 264, 274 are provided so that, if no gas is to be provided by the first or second tuning gas source 260, 270, the valves 264, 274 may be closed to prevent the mass flow controllers 262, 272 from leaking. The first and second tuning gas sources preferably have the same gases, but may have different gases.

The tuning gas feature of this invention provides a higher degree of zonal wafer etch rate variation. Rather than simply distributing various percentages of the same mixed gas to each wafer region which is the limit of a splitter, the tuning gas feature can be used solely by itself without any mixed gas in one wafer region to provide a more extreme variation of wafer etch rate. Also the tuning gas feature can provide unique subtle etch rate variations to a specific wafer region by adding a small amount of unique gas that may or may not be part of the mixed gas chemistry. The tuning gas feature provides many more wafer etch rate options than the prior art to ultimately achieve a higher degree of wafer etch rate uniformity. Wafer etch rate uniformity is becoming more challenging with the introduction of larger wafers, such as 300 mm, and smaller features sizes, such as $\leq 0.13$ micron.

Figure 3:
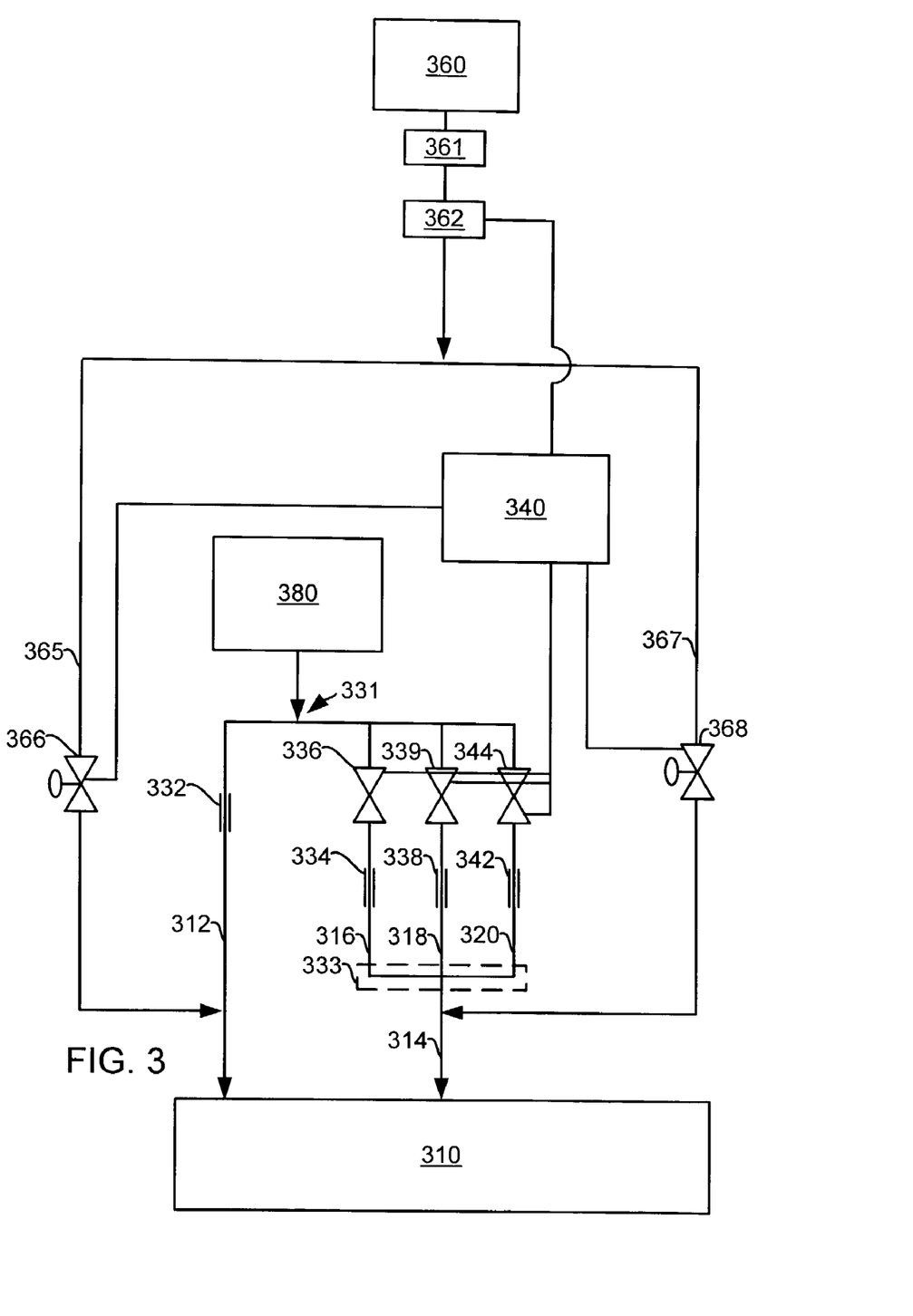
FIG. 3 is a schematic view of another tuning device on another dual gas feed device.

FIG. 3 is a schematic illustration of another embodiment of the invention. A plasma processing chamber 310 is supplied processing gas through gas supply line 312 (which can provide process gas to an outer zone of a showerhead) and a gas supply line 314 (which supplies processing gas to an inner zone of a showerhead). Thus the different gas supply lines 312, 314 provide gas to different parts of the plasma processing chamber 310. Processing gas is supplied to the gas lines 312, 314 from the gas supply 380 through a flow divider 331. In this embodiment, a fixed orifice 332 or needle valve or the like is placed on the first leg, formed by the gas supply line 312. The first leg in this embodiment is the master leg, where the orifice 332 is relatively wide open, but provides some small resistance on the gas supply line 312.

The second leg, formed by gas supply line 314, is formed by a first parallel flow 316, a second parallel flow 318, and a third parallel flow 320, which are joined together by a manifold 333. Other embodiments may have more or less parallel flows. The first parallel flow 316 has a first fixed orifice 334 and a first flow valve 336. The first fixed orifice 334 provides a resistance so that, when fluid passes only through the gas supply line 312 and the first parallel flow 316, 30% of the flow passes through the first parallel flow and the remaining 70% of the flow passes through the gas supply line 312. The second parallel flow 318 has a second fixed orifice 338 and a second flow valve 339. The second fixed orifice 338 provides a resistance so that, when fluid passes only through the gas supply line 312 and the second parallel flow 318, 20% of the flow passes through the second parallel flow and the remaining 80% of the flow passes through the gas supply line 312. The third parallel flow 320 has a third fixed orifice 342 and a third flow valve 344. The third fixed orifice 342 provides a resistance so that, when fluid passes only through the gas supply line 312 and the third parallel flow 320, 10% of the flow passes through the third parallel flow 320 and the remaining 90% of the flow passes through the gas supply line 312.

A downstream tuning gas supply 360 is also provided. A tuning gas mass flow controller 362 is in fluid connection with the downstream tuning gas supply 360 and is controllably connected to the control system 340. A pressure regulator 361 is placed between the downstream tuning gas supply 360 and the tuning gas mass flow controller 362. The flow of the tuning gas is divided into a first tuning line 365 in fluid connection with gas supply line 312 and a second tuning line 367 in fluid connection with gas supply line 314. A first tuning valve 366 may be provided on the first tuning line 365. A second tuning valve 368 may be provided on the second tuning line 367. The tuning gas is preferably the same as a component gas provided by the gas supply 380. The tuning gas is provided downstream from the first fixed orifice 334, the second fixed orifice 338, and the third fixed orifice 342 on the second leg. The tuning gas is provided downstream from the orifice 332 of the first leg.

The control system 340 is controllably connected to the tuning gas mass flow controller 362, the first flow valve 336, the second flow valve 339, the third flow valve 344, the first tuning valve 366, and the second tuning valve 368.

In operation, the user would select set points for the flows of each feed gas within the gas box, and would select the fraction of mixed flow to be delivered to each region of the processing chamber. For example, the user might select that 70% of the flow be delivered through line 312 and 30% through line 314. In such a case, the first flow valve 336 is opened to allow flow, while the second flow valve 339 and the third flow valve 344 are closed. The gas flows through only gas supply line 312 and the first parallel flow 316 of gas supply line 314. In this example, the first fixed orifice 334 acts as a flow resistance device in the second leg to obtain the desired 70:30 flow ratio between the first leg and second leg. The control system 340 is able to adjust the resistance and thus the flow through the second leg by opening one of the first, second, or third flow valves 336, 339, 344 to provide flow through the first, second, or third fixed orifices, which provide different resistances.

Thus the gas delivered through a first leg, line 312, is identical to the gas delivered through the second leg, line 314 with a flow ratio of 70:30. In addition to having different flow ratios between the different legs, it is desirable to have other differences in the gases delivered through the legs. In this example, it is desired that a higher concentration of an active etching gas component is desired in the second leg, line 314. The controller 340 provides signals to the tuning gas mass flow controller 362 to provide the desired flow rate of the tuning gas. The controller 340 also provides signals to close the first tuning valve 366 and open the second tuning valve 368. This results in tuning gas flowing from the tuning gas source 360, through the tuning gas mass flow control 362 and through the second tuning valve to gas supply line 314.

The controller 340 may be any computer system that has computer readable media with computer code to instruct the controller when to open and close valves.

In a preferred embodiment of the invention, the plasma processing chamber uses a confined plasma system, which confines the plasma to a region above the wafer. Such a confined plasma system may use confinement rings, as disclosed in U.S. Pat. No. 6,019,060, by Eric Lenz, entitled "CAM-BASED ARRANGEMENT FOR POSITIONING CONFINEMENT RINGS IN A PLASMA PROCESSING CHAMBER", issued Feb. 1, 2000, which is incorporated by reference for all purposes. Such a plasma confinement system is used in the 2300 Exelan chamber, made by Lam Research Corporation of Fremont, Calif.

Figure 4A:
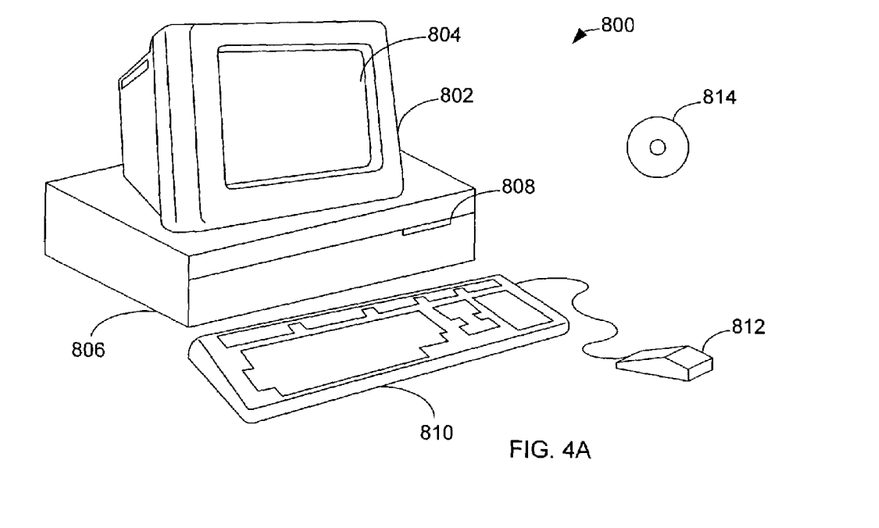
FIGS. 4A–B are schematic illustrations of a computer system that may be used as a controller.
Figure 4B:
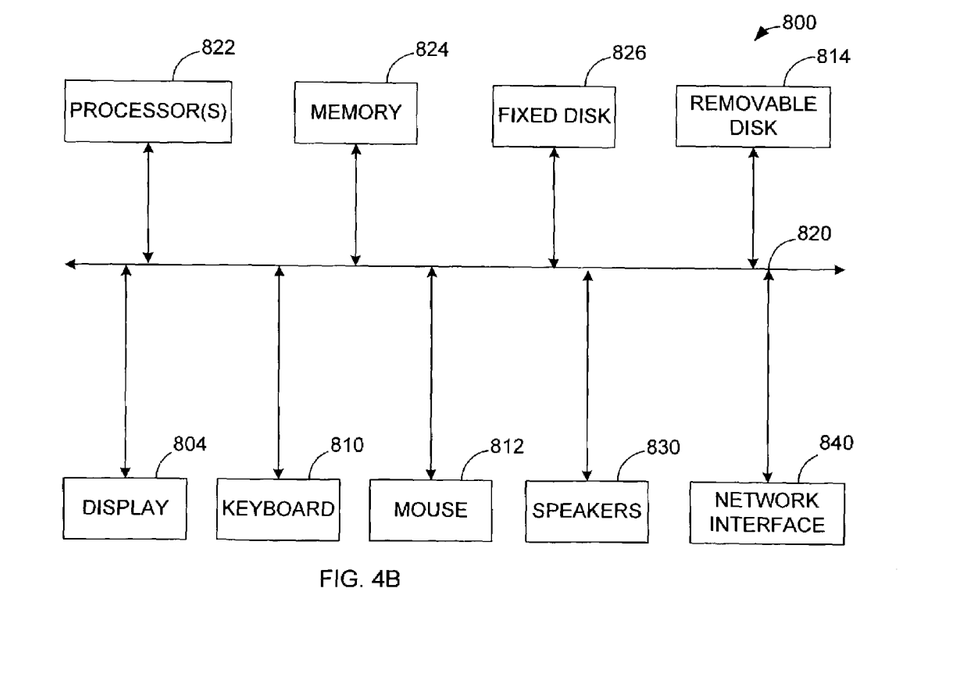

FIGS. 4A and 4B illustrate a computer system 800, which is suitable for using as the controller 340. FIG. 4A shows one possible physical form of a computer system that may be used for the controller 340. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 4B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 826 is also coupled bi-directionally to CPU 822; it provides additional data storage capacity and may also include any of the computer-readable media described below. Fixed disk 826 may be used,to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An apparatus for providing different gases to different zones of a processing chamber, comprising:
   a gas supply for providing an etching gas flow;
   a first leg;
   a second leg, wherein the second leg comprises
      a first parallel flow;
      a second parallel flow;
      a third parallel flow;
      a supply line;
      a manifold which combines output from the first parallel flow, the second parallel flow, and the third parallel flow into the supply line;
      a first flow valve on the first parallel flow;
      a first fixed orifice on the first parallel flow;
      a second flow valve on the second parallel flow,
      a second fixed orifice on the second parallel flow;
      a third flow valve on the third parallel flow; and
      a third fixed orifice on the third parallel flow;

flow splitter in fluid connection with the gas supply for splitting the etching gas flow from the gas supply into the first leg and the second leg connected between the gas supply and the first leg and the second leg a tuning gas system in fluid connection to at least one of the legs of the first and second legs, wherein the gas tuning system comprises:
at least one tuning gas source; and
at least one mass flow controller; and a controller controllably connected to the first flow valve, the second flow valve, the third flow valve, and the at least one mass flow controller of the tuning system.

2. The apparatus, as recited in claim 1, wherein the first leg is in fluid connection with a first zone of the processing chamber and the second leg is in fluid connection with a second zone of the processing chamber.

3. The apparatus, as recited in claim 2, wherein the flow splitter further comprises a flow resistance device on the first leg for maintaining a flow ratio between the first leg and the second leg.

4. The apparatus, as recited in claim 3, wherein the tuning gas system is in fluid connection with the first leg and the second leg.

5. The apparatus, as recited in claim 4, wherein the tuning gas system provides a component gas provided by the gas supply.

6. The apparatus, as recited in claim 5, wherein the tuning gas system provides tuning gas down stream from the flow resistance device and down stream from the first fixed orifice, the second fixed orifice, and the third fixed orifice.

7. The apparatus, as recited in claim 6, wherein the flow resistance device comprises a fourth fixed orifice.

8. The apparatus, as recited in claim 3, wherein the tuning gas system provides tuning gas down steam from the flow resistance device.

9. A tuning system for tuning a gas feed system for a processing chamber with a controller, wherein the gas feed system comprises a first leg for supplying a processing gas to a first part of the processing chamber, a second leg for supplying the processing gas to a second part of the processing chamber, and a flow ratio device with a feedback control valve and flow measurement device for maintaining a flow ratio between the first leg and the second leg connected to the controller, wherein the flow ratio device is connected to said first and second legs, wherein the tuning system comprises:
a first gas line in fluid connection with the first leg;
a second gas line in fluid connection with the second leg;
a tuning gas source in fluid connection with the first gas line and the second gas line at points between the processing chamber and the connections between flow ratio device and the first and second legs; and
a mass flow controller connected between the first gas line and the tuning gas source and connected to the controller, wherein the controller uses data from the flow measurement device and provides a signal to the feedback control valve for maintaining the flow ratio between the first leg and the second leg.

10. The tuning system, as recited in claim 9, wherein the tuning gas source comprises:
a first tuning gas supply in fluid connection with the first gas line; and
a second tuning gas supply in fluid connection with the second gas line.

11. The tuning system, as recited in claim 10, further comprising a second mass flow controller connected between the second tuning gas supply and the second gas line.

12. An apparatus for providing different gases to different zones of a processing chamber, comprising:
a gas supply for providing an etching gas flow;
a first leg;
a second leg comprising:
a feedback control valve; and
a flow measurement device;
flow splitter in fluid connection with the gas supply for splitting the etching gas flow from the gas supply into the first leg and the second leg connected between the gas supply the first leg and the second leg;
a tuning gas system in fluid connection to at least one of the legs of to first and second legs, wherein the gas tuning system comprises:
at least one tuning gas source; and
at least one mass flow controller; and
a controller controllably connected to the at least one mass flow controller of the tuning system, the flow measurement device, and to feedback control valve, wherein the controller receives input from the flow measurement device arid provides output to the feedback control valve based on flow measured by the flow measurement device to maintain a flow ratio between the first leg and the second leg.

13. The apparatus, as recited in claim 12, wherein the first leg is in fluid connection with a first zone of the processing chamber and the second leg is in fluid connection with a second zone of the processing chamber.

* * * * *